(12) United States Patent
Goarin

(10) Patent No.: US 8,110,455 B2
(45) Date of Patent: Feb. 7, 2012

(54) SEMICONDUCTOR DEVICE AND A METHOD OF MANUFACTURING THE SAME

(75) Inventor: Pierre Goarin, Graz (AT)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 12/864,775

(22) PCT Filed: Jan. 26, 2009

(86) PCT No.: PCT/IB2009/050298
§ 371 (c)(1),
(2), (4) Date: Jul. 27, 2010

(87) PCT Pub. No.: WO2009/095835
PCT Pub. Date: Aug. 6, 2009

(65) Prior Publication Data
US 2010/0320513 A1    Dec. 23, 2010

(30) Foreign Application Priority Data
Jan. 31, 2008    (EP) .................................... 08101173

(51) Int. Cl.
*H01L 21/00*    (2006.01)
(52) U.S. Cl. .......................... 438/164; 257/347; 438/296
(58) Field of Classification Search .......... 438/151–166, 438/296, 424; 257/E21.561, 347
See application file for complete search history.

(56) References Cited

U.S. PATENT DOCUMENTS
2001/0039100 A1    11/2001    Gonzalez et al.
2002/0001965 A1    1/2002    Forbes
2005/0029619 A1    2/2005    Forbes
2005/0098094 A1    5/2005    Oh et al.
2006/0267152 A1    11/2006    Forbes FOREIGN PATENT DOCUMENTS
JP    61201444 A    9/1986
WO    2007000690 A1    1/2007

OTHER PUBLICATIONS

Saarnilehot, E., et al; "Local Buried Oxide Technology for HV Transistors Integrated in CMOS"; 19$^{th}$ Intl Symposium on Power Semidonductor Devices and ICS; p. 81-84 (May 1, 2007).
Kim, Sung Hwan, et al; "Lateral Integration of Partially Insulated and Bulk MOSFETS Using Partial SOI Process"; SOI Conference; IEEE; Piscataway, NJ, US; pp. 174-175; (Oct. 3, 2005).
International Search Report and Written Opinion for Application PCT/IB2009/050298 (Jan. 26, 2009).

*Primary Examiner* — Richard A. Booth

(57) ABSTRACT

A method of manufacturing a semiconductor device (1200), the method comprising forming a sacrificial pattern having a recess on a substrate (402), filling the recess and covering the substrate and the sacrificial pattern with a semiconductor structure, forming an annular trench in the semiconductor structure to expose a portion of the sacrificial pattern and to separate material (904) of the semiconductor structure enclosed by the annular trench from material (906) of the semiconductor structure surrounding the annular trench, removing the exposed sacrificial pattern to expose material of the semiconductor structure filling the recess, and converting the exposed material of the semiconductor structure filling the recess into electrically insulting material (1202).

15 Claims, 4 Drawing Sheets

SEMICONDUCTOR DEVICE AND A METHOD OF MANUFACTURING THE SAME

FIELD OF THE INVENTION

The invention relates to a semiconductor device.

Moreover, the invention relates to a method of manufacturing a semiconductor device.

BACKGROUND OF THE INVENTION

Semiconductor devices like a MOSFET (=Metal Oxide Semiconductor Field Effect Transistor) device or an IC (=Integrated Circuit) comprising such a transistor are required for many applications in silicon technology such as logic transistors and memory transistors, particularly manufactured in CMOS technology. However, other semiconductor devices may be employed in integrated circuits as well.

Saarnilehto, E., Sonsky, J., Meunier-Beillard, P., Neuilly, F., "Local Buried oxide technology for HV transistors integrated in CMOS", 19th International Symposium on Power Semiconductor Devices and ICs, 2007, pp. 81 to 84 discloses that automotive applications require full dielectric isolation of the high voltage and analog components. Such isolation is typically realized by BCD technologies built on SOI (=Silicon on insulator). The drawbacks of using SOI wafers, i.e. deviation from the baseline bulk CMOS and increased overall cost, can be addressed by manufacturing local SOI islands in the standard bulk wafer. A method to manufacture a local buried oxide using LoBOX technology and its integration to baseline CMOS is disclosed. The LoBOX technology is based on a sacrificial SiGe layer buried in bulk substrate and subsequently replaced with oxide. It is a general isolation solution that allows flexible local SOI and local BOX thickness. The LoBOX technology is integrated in a 130 nm bulk CMOS process to demonstrate its feasibility. The manufactured HV transistors isolated with local BOX, feature almost identical performance as those manufactured on commercial SOI wafers.

US 2005/0098094 discloses a partially insulated field effect transistor and a method of fabricating the same. A semiconductor substrate is formed by sequentially stacking a bottom semiconductor layer, a sacrificial layer, and a top semiconductor layer. The sacrificial layer may be removed to form a buried gap region between the bottom semiconductor layer and the top semiconductor layer. Then, a transistor may be formed on the semiconductor substrate. The sacrificial layer may be a crystalline semiconductor formed by an epitaxial growth technology.

US 2002/0001965 discloses that, using sub-micron technology, silicon on insulator (SOI) rows and islands are formed in a silicon substrate. Trenches are directionally-etched in the silicon substrate, leaving rows of silicon between the trenches. Silicon nitride is then deposited over the trenches, extending partly down the sides of the trenches. An isotropic chemical etch is then used to partially undercut narrow rows of silicon in the substrate. A subsequent oxidation step fully undercuts the rows of silicon, isolating the silicon rows from adjacent active areas. Devices, such as transistors for CMOS and DRAMs, are then formed in active areas, wherein the active areas are defined on the silicon rows by LOCal Oxidation of Silicon (LOCOS).

However, conventional manufacture procedures for semiconductor devices may be cumbersome and expensive.

OBJECT AND SUMMARY OF THE INVENTION

It is an object of the invention to provide a semiconductor architecture, which may be manufactured with reasonable effort.

In order to achieve the object defined above, a semiconductor device and a method of manufacturing a semiconductor device according to the independent claims are provided.

According to an exemplary embodiment of the invention, a method of manufacturing a semiconductor device (for instance an integrated circuit member such as a field effect transistor) is provided, the method comprising forming a sacrificial pattern (for instance a structure or pattern of a material to be sacrificed, i.e. at least partially removed, in subsequent procedural steps) having a recess (for instance an internal through hole) on a substrate (which may be a semiconductor substrate, for instance a silicon substrate), filling the recess and covering the substrate and the sacrificial pattern with a semiconductor structure (for instance silicon material), forming an annular trench in the semiconductor structure to expose a portion of the (previously buried) sacrificial pattern and to separate (separated by the trench) material of the semiconductor structure enclosed by the annular trench from material of the semiconductor structure surrounding the annular trench, removing the exposed sacrificial pattern to expose material of the semiconductor structure filling the recess, and converting the (for instance entire) exposed material of the semiconductor structure filling the recess into electrically insulating material (for instance by a thermal or chemical oxidation procedure).

According to another exemplary embodiment of the invention, a semiconductor device is provided which is manufactured according to the above mentioned method.

The term "substrate" may denote any suitable material, such as a semiconductor, glass, plastic, etc. According to an exemplary embodiment, the term "substrate" may be used to define generally the elements for layers that underlie and/or overlie a layer or portions of interest. Also, the substrate may be any other base on which a layer is formed, for example a semiconductor wafer such as a silicon wafer or silicon chip.

The semiconductor device may be a transistor, and the formed entirely insulated island may serve as a gate region thereof. The transistor may be a field effect transistor. The term "field effect transistor" (FET) may denote a transistor in which an output current (source-drain current) may be controlled by the voltage applied to a gate which can be an MOS structure (MOSFET). A FET is a unipolar transistor, that is current is controlled by majority carriers only.

According to an exemplary embodiment of the invention, an integrated semiconductor member may be manufactured using a structured buried sacrificial pattern, which is exposed by forming a ring-like trench to thereby allow for subsequently removing the buried sacrificial pattern. After such a removal procedure material, which has previously been deposited on the sacrificial structure, may serve as a kind of foot for mechanically connecting a bottom substrate with a top semiconductor island of the deposited material. By selectively oxidizing the (sufficiently small-dimensioned) semiconductor foot, its property may be converted from semiconductive into electrically insulating, thereby allowing to manufacture a completely isolated silicon island which is embedded entirely in an electrically insulating environment and which can be manufactured with a single mask, namely a mask for forming the trenches for separation and exposing purpose. Such a semiconductor device may particularly serve for generating a gate region that is decoupled properly from an environment, which may be of particular advantage in CMOS architecture. The sufficiency of only one mask for the isolation architecture may allow manufacturing the semiconductor device with reasonable cost.

According to an exemplary embodiment of the invention, a method of forming a Si island is provided using a buried SiGe layer that is accessed and selectively etched. The SiGe layer may be patterned in such a way that when the SiGe layer is fully underetched from all sides, there are still "feet" of silicon left to support the overlying silicon layer. In a subsequent step the silicon feet may be oxidized and the cavity may be filled with oxide to form a fully isolated silicon island.

In particular, a number of silicon feet may be provided to prevent the silicon layer to collapse. Next, an oxidation may be performed to oxidize these silicon feet and then an electrically insulating material such as silicon oxide may be deposited to fill the cavity and make a buried oxide layer. In that manner the under etch may be done from all sides and the silicon island may be directly formed fully surrounded by silicon oxide.

This may advantageously reduced the number of required process steps. Embodiments of the invention may be applied or used in any processes which would benefit from silicon islands fully isolated by oxide from the rest of the silicon. for instance BCD processes.

According to an exemplary embodiment of the invention, a method is provided forming trenches, and making an underetch from all sides in the trench sidewalls using a sacrificial layer (SiGe), thus making a Si-island. The feet may then be oxidised and the trench may be filled with silicon oxide, silicon nitride or the like. The Si-island may be isolated from all sides.

Thus, a buried silicon oxide structure may be formed using underetch of a SiGe layer with only one mask step. For low voltage LDMOS, the overall resistance of the device may mainly come from the channel resistance. In standard LDMOS, since the gate is at the top of the device, it is possible to just increase the width of the gate to get the amount of current needed. According to an exemplary embodiment of the invention, increasing the gate density may reduce the channel resistance. One exemplary aspect consists in burying the gate into the silicon to increase the gate area for the same device area.

According to an embodiment of the invention, it is possible to use a SiGe layer to create underetch. The intention is to fully isolate the silicon island. It is further possible to oxidize the "silicon foot". The pattern in the SiGe layer can be performed to extend underetch capabilities of the SiGe etch. A selective etch of a SiGe layer may be used for creating a locally isolated silicon island. The combination of a patterned SiGe layer, a selective underetech of the SiGe layer, and an oxidation of the silicon "feet" to get fully isolated silicon island may be of particular advantage.

In the following, further exemplary embodiments of the method will be explained. However, these embodiments also apply to the semiconductor device.

The recess may be formed as a contiguous recess within (for instance surrounded by) the sacrificial pattern. In such an embodiment, the recess is formed by a continuous structure that is connected entirely to one another to form a mechanically sufficiently stable support between substrate and semiconductor island.

The recess may comprise a plurality of non-contiguous recess portions within the sacrificial pattern. For example, a number of matrix-like arranged posts having a rectangular or circular or oval cross-sectional shape may be formed to provide for an electrically insulating supporting structure with high mechanical and thermal stability.

The recess may be formed with a post-like shape, particularly may be formed with a star-like shape. Such a star-like shape may comprise a plurality (for instance 4 or 6) of beams aligned from a center towards different angular directions in a surface plane of the substrate to thereby provide a mechanically stable architecture, which properly supports the relatively heavy silicon island relative to the substrate.

The sacrificial pattern may be formed as an alloy of silicon and a further group IV semiconductor. It is of particular suitability to use an alloy of silicon and germanium (SiGe) as a material for such a sacrificial pattern, since such a material can be removed by a selective etching procedure.

The exposed sacrificial pattern may be removed by underetching, particularly by selectively underetching of the material of the sacrificial structure. In other words, an etching procedure may be implemented which allows to safely and precisely remove only material of the sacrificial pattern so that other semiconductor materials usable for manufacturing the semiconductor device may remain free of an undesired removal by etching.

The exposed material of the semiconductor structure may be converted into electrically insulting material by oxidizing. Such a procedure may be performed by a thermal oxidation heating the exposed material of the semiconductor structure to such a temperature in the presence of oxygen, that a conversion of silicon into silicon oxide takes place. This goes hand in hand with a conversion of electrically semiconductive material into electrically insulating material, thereby ensuring that the silicon island is completely isolated with regard to an environment.

The method may comprise filling the annular trench with electrically insulating material. The hollow portions of the layer sequence may thus be filled with an electrically insulating material such as silicon oxide or silicon nitride, thereby improving the mechanical stability and embedding the silicon island completely and from all sides in an electrically insulating environment.

The method may comprise fully electrically insulating the material of the semiconductor structure enclosed by the annular trench with regard to an environment. This may be achieved by selecting an annular trench, which extends around a 360° angle of the silicon island, thereby completely decoupling the silicon island from the surrounding environment.

The method may comprise configuring the material of the semiconductor structure enclosed by the annular trench as a gate of a transistor. For a transistor gate, the complete surrounding isolation may be of particularly importance in order to prevent undesired crosstalk with adjacent transistors and to prevent any undesired migration of material, which might deteriorate the quality of a transistor structure.

Embodiments of the invention may apply to any smart patterning of a SiGe layer. Some specific examples are explicitly explained herein, but it is possible to implement others. In fact, a goal may be to have a large or the largest possible Si area underetched and still standing with a small or the minimum "feet" area and the pattern, to allow for an easy oxidation later on.

The method may be performed in CMOS technology, i.e. semiconductor structures of the p-type of conductivity and the n-type of conductivity may both be formed in the semiconductor device, each of which being electrically decoupled from one another. Any CMOS technology generation may be used. When using CMOS technology, a known and cheap method may be used for manufacturing the transistor.

Such a semiconductor device can be any integrated circuit and may comprise a logic circuitry and/or memory cells. The material of the semiconductor structure may be silicon, germanium, or any other semiconductor.

The substrate may be a semiconductor substrate. The transistor device may be monolithically integrated in the semiconductor substrate, particularly comprising one of the group consisting of a group IV semiconductor (such as silicon or germanium), and a group III-group V semiconductor (such as gallium arsenide).

For any method step, any conventional procedure as known from semiconductor technology may be implemented. Forming layers or components may include deposition techniques like CVD (chemical vapour deposition), PECVD (plasma enhanced chemical vapour deposition), ALD (atomic layer deposition), or sputtering. Removing layers or components may include etching techniques like wet etching, plasma etching, etc., as well as patterning techniques like optical lithography, UV lithography, electron beam lithography, etc.

Embodiments of the invention are not bound to specific materials, so that many different materials may be used. For conductive structures, it may be possible to use metallization structures, silicide structures or polysilicon structures. For semiconductor regions or components, crystalline silicon may be used. For insulating portions, silicon oxide or silicon nitride may be used.

The transistor may be formed on a purely crystalline silicon wafer or on an SOI wafer (Silicon On Insulator).

Any process technologies like CMOS, BIPOLAR, BICMOS may be implemented.

The aspects defined above and further aspects of the invention are apparent from the examples of embodiment to be described hereinafter and are explained with reference to these examples of embodiment.

BRIEF DESCRIPTION OF THE DRAWINGS

The invention will be described in more detail hereinafter with reference to examples of embodiment but to which the invention is not limited.

DESCRIPTION OF EMBODIMENTS

Figure 1:
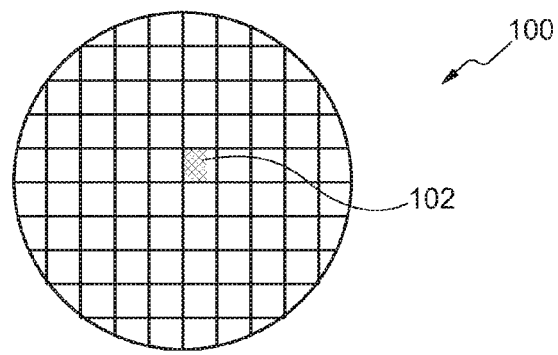
FIG. 1 illustrates a wafer having a plurality of chips/integrated circuits according to an exemplary embodiment of the invention.

The illustration in the drawing is schematical. In different drawings, similar or identical elements are provided with the same reference signs.

FIG. 1 illustrates a wafer 100 having a plurality of electronic chips 102.

Figure 2:
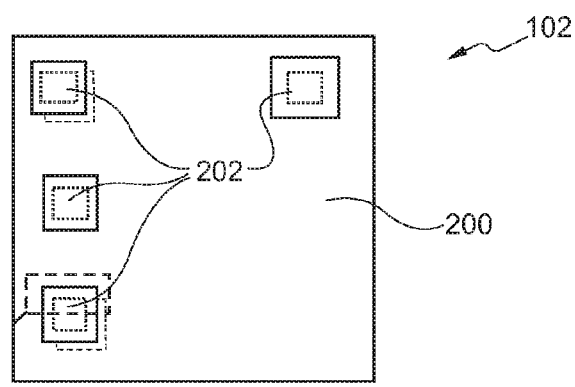
FIG. 2 illustrates a chip singularized from the wafer of FIG. 1 according to an exemplary embodiment of the invention.

FIG. 2 shows one of the chips 102 after singularization from the wafer 100 and comprises a bulk silicon substrate 200 and a plurality of semiconductor components 202 isolated from one another.

Figure 3:
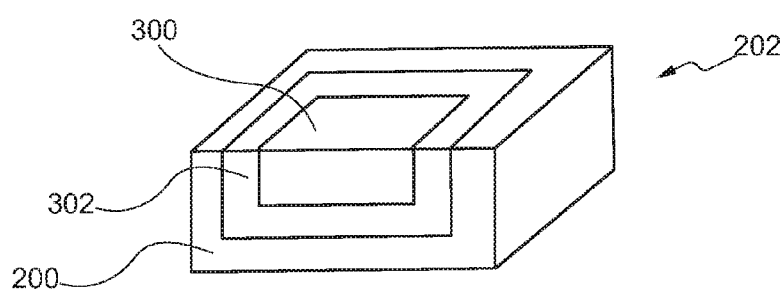
FIG. 3 illustrates a semiconductor component of the chip of FIG. 2 according to an exemplary embodiment of the invention.
Figure 4:
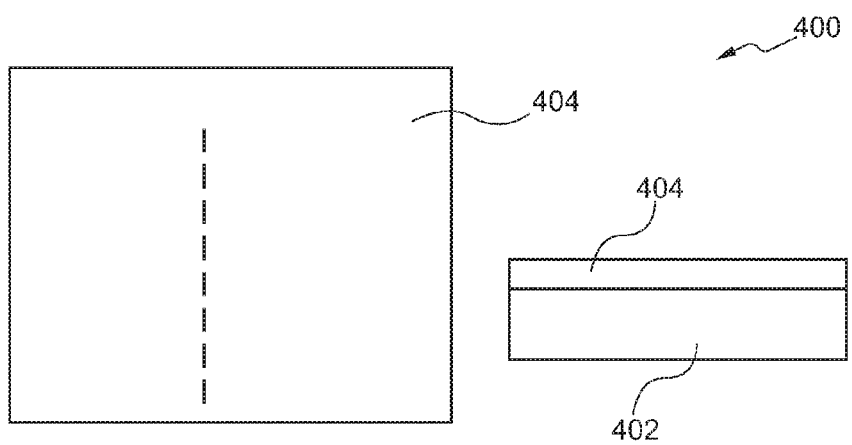
FIG. 4 to FIG. 12 show layer sequences of a method of manufacturing a semiconductor device according to an exemplary embodiment of the invention.

FIG. 3 shows one of the semiconductor components 202 having completely isolated silicon islands 300 embedded in a silicon oxide matrix 302 which is in turn embedded in silicon material of the semiconductor substrate 200. The silicon island 300 is locally isolated without the necessity to use an expensive SOI substrate.

For some applications (such as high voltage MOSFETs, diodes, ESD protection, etc.), it is highly desirable to have part of the silicon (namely the silicon island 300) completely isolated against the rest of the silicon 200 by silicon oxide 302 (see FIG. 1 to FIG. 3).

Especially for CMOS processes where p-MOS and n-MOS devices have to be next to each other, with standard processes, this can conventionally only be achieved via deep implanted wells, costly epitaxy processes or the use of SOI wafers.

Embodiments of the invention use the principle of a buried SiGe layer and the use of a selective etch towards silicon and provides a method to obtain a fully isolated silicon island in only one mask step (see FIG. 4 to FIG. 12).

According to an exemplary embodiment, a SiGe layer is patterned in such a way that when the SiGe layer is fully underetched from all sides, there are still "feet" of silicon left to support the overlying silicon layer. They are later on oxidised and then a remaining cavity may be filled with silicon oxide to form a fully isolated silicon island.

Another feature of exemplary embodiments of the invention is to allow underetch of the SiGe layer from all sides. This enables a larger silicon area to be underetched.

Figure 13:
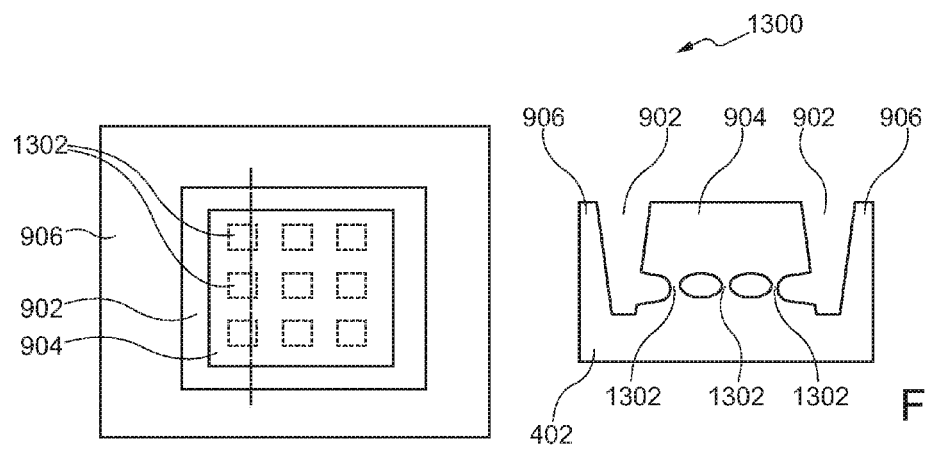
FIG. 13 to FIG. 15 show layer sequences of alternative embodiments of forming a semiconductor device according to exemplary embodiments of the invention.
Figure 14:
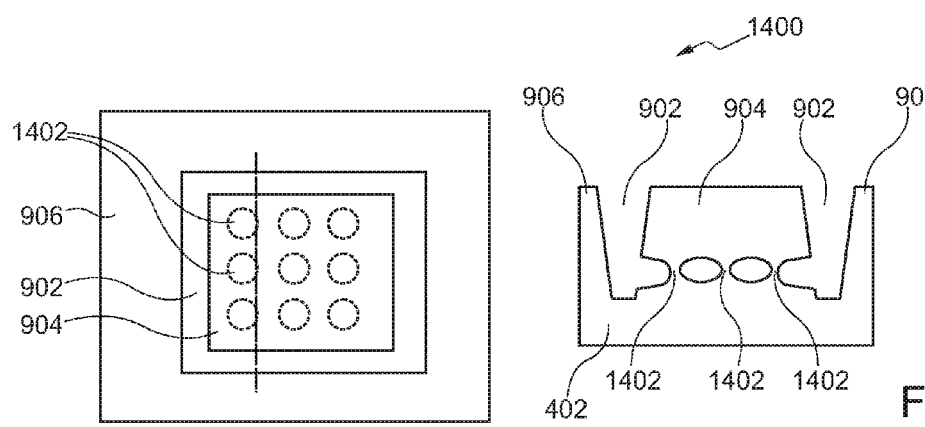
Figure 15:
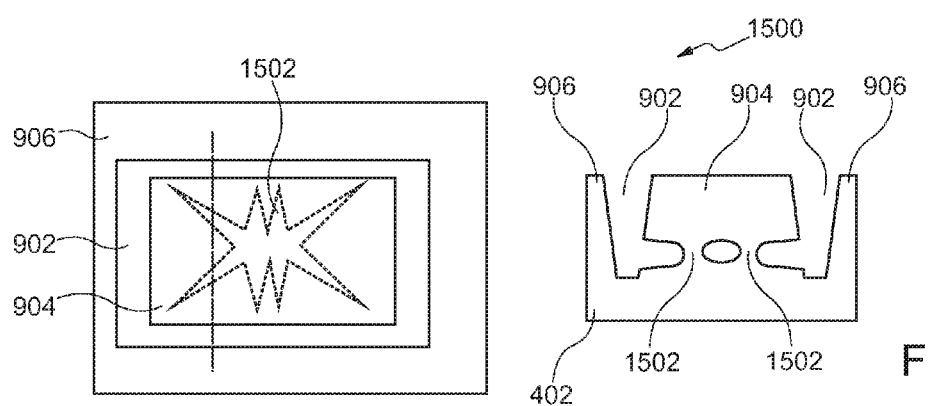

Embodiments of the invention are not restricted to the examples of pattern of the SiGe described (see FIG. 13 to FIG. 15). Embodiments of the invention apply to any kind of pattern for the SiGe layer suitable for underetch. Embodiments of the invention also apply to processes where the cavity formed after undertech would be enlarged by any isotropic etches. Although silicon oxide filling for isolation may be appropriate, it is not restricted to this material (it can also be a combination of silicon oxide, polysilicon, silicon nitride, etc.).

In the following, referring to FIG. 4 to FIG. 12, a method of manufacturing a semiconductor device 1200 according to an exemplary embodiment of the invention will be explained.

In each of FIG. 4 to FIG. 12, a plan view of a corresponding layer sequence is shown on the left-hand side, and a cross-sectional view of the respective layer sequence is shown on the right-hand side. A dotted line indicates a line along which the cross section is shown To obtain a layer sequence 400 shown in FIG. 4, a hard mask 404 is deposited on a silicon substrate 402.

Figure 5:
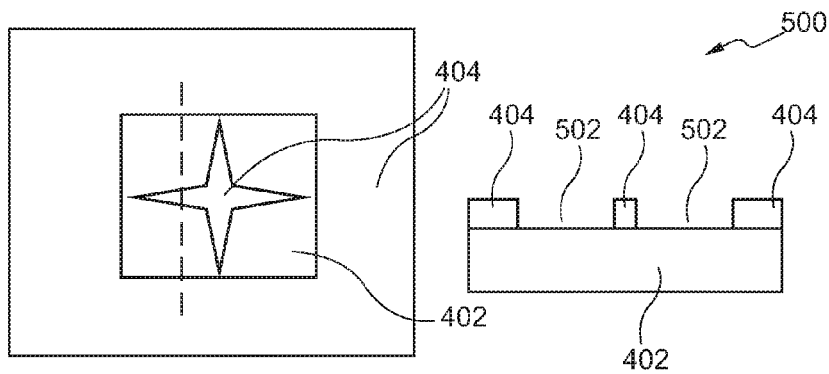

In order to obtain a layer sequence 500 shown in FIG. 5, the hard mask 404 is patterned to form a hard mask recess 502.

Figure 6:
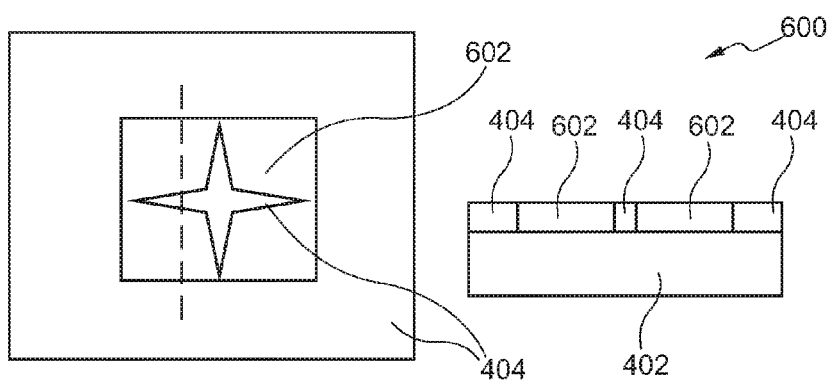

In order to obtain a layer sequence 600 shown in FIG. 6, a silicon germanium (SiGe) structure 602 is grown on the exposed surface portions of the substrate 402. i.e. to fill the hard mask recess 502.

Figure 7:
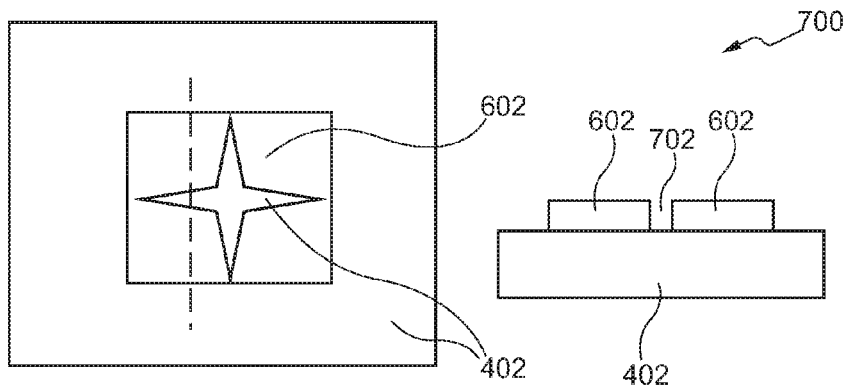

In order to obtain a layer sequence 700 shown in FIG. 7, the hard mask 404 is removed, for instance by etching, thereby forming a recess 702.

Figure 8:
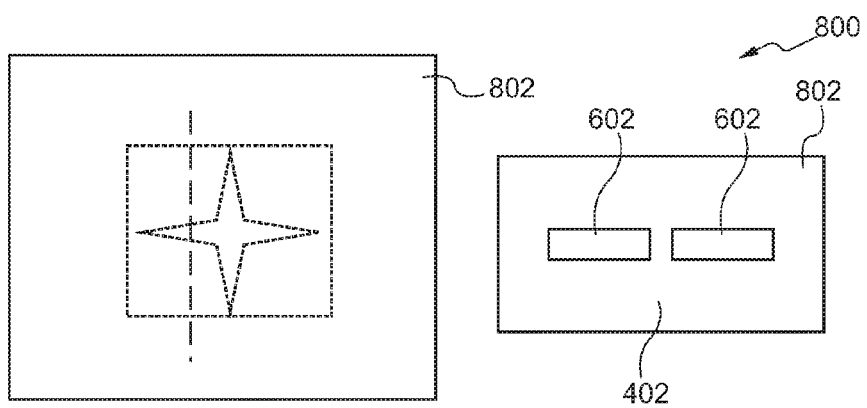

In order to obtain a layer sequence 800 shown in FIG. 8, silicon material is epitaxially grown on the exposed portions of the silicon substrate 402. By taking this measure, a silicon structure 802 is formed covering the silicon substrate 402 as well as the SiGe structure 602.

Figure 9:
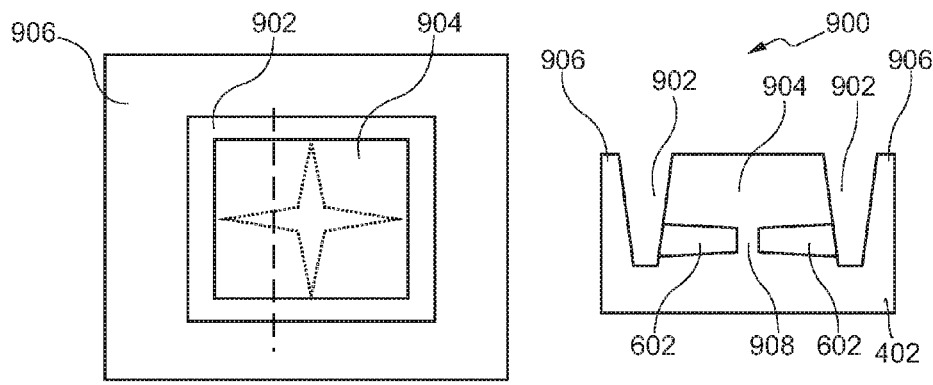

In order to obtain a layer sequence 900 shown in FIG. 9, an annular trench 902 is etched to surround the silicon germanium area 602. Thus, lateral portions of the sacrificial pattern 602 of silicon germanium material are exposed. Furthermore, by this etching procedure, material 904 of the silicon structure 802 enclosed by the annular trench 902 is separated from material 906 of the silicon structure 802 surrounding the annular trench 902. The recess 702 formed within the sacrificial pattern 602 is filled with silicon material 908.

Figure 10:
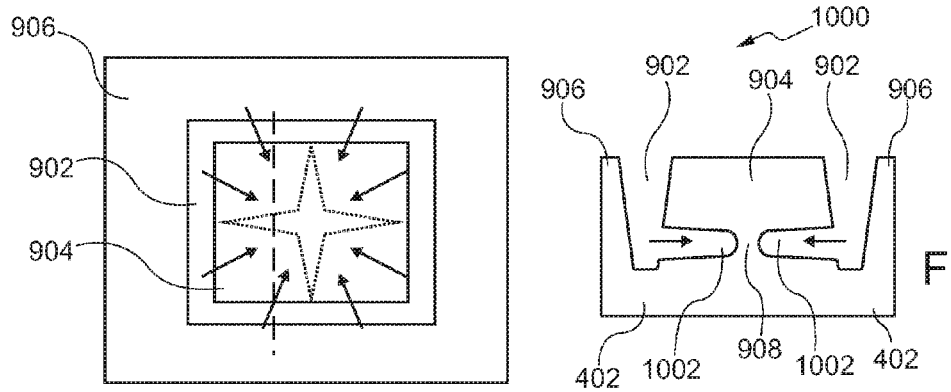

In order to obtain a layer sequence 1000 shown in FIG. 10, the silicon germanium structure 602 is removed by an underetching procedure. By taking this measure, indentations 1002 are formed exposing the post-like structure 908 of the silicon material 802.

Figure 11:
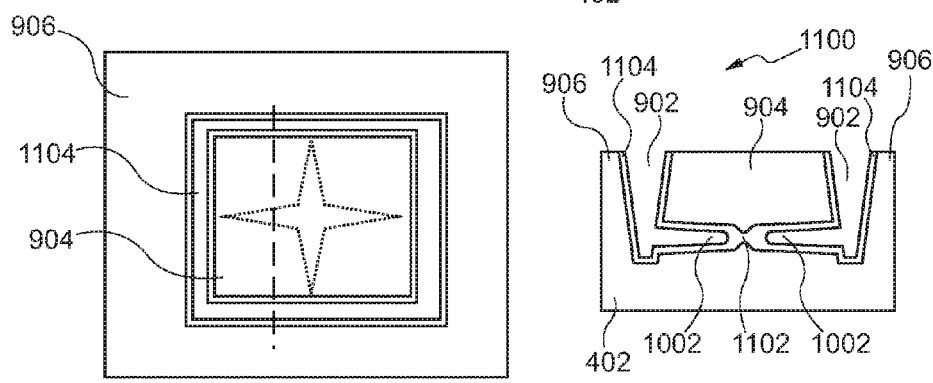

To obtain a layer sequence 1100 shown in FIG. 11, the silicon foot 908 is oxidized and is thereby converted into an electrically insulating silicon oxide post 1102. Also, remaining exposed surface portions of the silicon structure 1100 comprise a thin silicon oxide skin 1104 as a consequence of the procedure.

Figure 12:
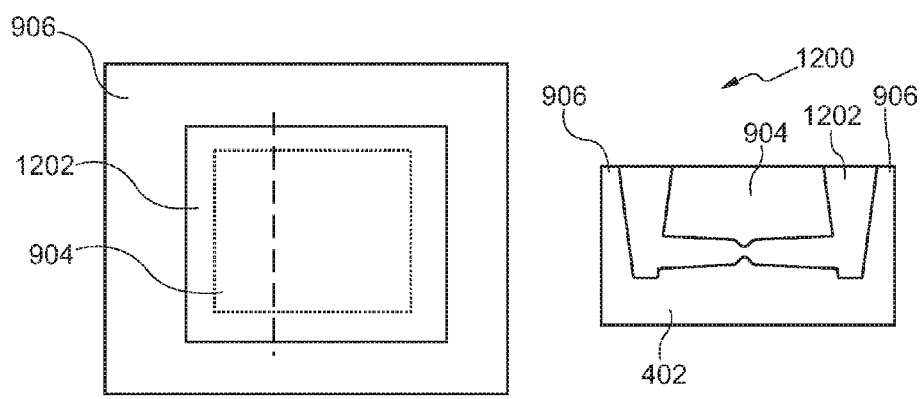

In order to obtain a layer sequence 1200 shown in FIG. 12, the cavity 902, 1002 is filled with silicon oxide material 1202, thereby finishing the silicon island 904, which is completely insulated with regard to an environment.

The procedure may be continued to form a transistor based on the layer sequence 1200 shown in FIG. 12, wherein the silicon island 904 can form the basis for a gate.

FIG. 13 shows an alternative embodiment in which a plurality of matrix-like arranged square like silicon support structures 1302 are embedded in a layer sequence 1300.

While FIG. 13 shows evenly distributed squares, a layer sequence 1400 shown in FIG. 14 comprises evenly distributed structures with a circular cross-section, see reference numeral 1402.

The embodiment of FIG. 15 shows a layer sequence 1500 having a star-shaped structure 1502.

Finally, it should be noted that the above-mentioned embodiments illustrate rather than limit the invention, and that those skilled in the art will be capable of designing many alternative embodiments without departing from the scope of the invention as defined by the appended claims. In the claims, any reference signs placed in parentheses shall not be construed as limiting the claims. The words "comprising" and "comprises", and the like, do not exclude the presence of elements or steps other than those listed in any claim or the specification as a whole. The singular reference of an element does not exclude the plural reference of such elements and vice-versa. In a device claim enumerating several means, several of these means may be embodied by one and the same item of software or hardware. The mere fact that certain measures are recited in mutually different dependent claims does not indicate that a combination of these measures cannot be used to advantage.

The invention claimed is:

1. A method of manufacturing a semiconductor device, the method comprising
   forming a sacrificial pattern having a recess on a substrate;
   filling the recess and covering the substrate and the sacrificial pattern with a semiconductor structure;
   forming an annular trench in the semiconductor structure to expose a portion of the sacrificial pattern and to separate material of the semiconductor structure enclosed by the annular trench from material of the semiconductor structure surrounding the annular trench;
   removing the exposed sacrificial pattern to expose material of the semiconductor structure filling the recess;
   converting the exposed material of the semiconductor structure filling the recess into electrically insulting material.

2. The method of claim 1, wherein the recess is formed as a contiguous recess within the sacrificial pattern.

3. The method of claim 1, wherein the recess comprises a plurality of non-contiguous recess portions within the sacrificial pattern.

4. The method of claim 1, wherein the recess is formed in one of the following ways: in a post-like manner, in a star-like manner.

5. The method of claim 1, wherein the sacrificial pattern is formed as a mixture of silicon and one of the following: a further group IV semiconductor material, germanium.

6. The method of claim 1, wherein the exposed sacrificial pattern is removed by underetching and/or selectively underetching.

7. The method of claim 1, wherein the exposed material of the semiconductor structure is converted into electrically insulting material by oxidation.

8. The method of claim 1, comprising filling the annular trench with electrically insulating material.

9. The method of claim 1, comprising fully electrically insulating the material of the semiconductor structure enclosed by the annular trench with regard to an environment.

10. The method of claim 1, comprising configuring the material of the semiconductor structure enclosed by the annular trench as a gate of a transistor.

11. The method of claim 1, wherein the annular trench is formed as a circumferentially closed annular trench.

12. The method of claim 1, performed in CMOS technology.

13. A semiconductor device, manufactured according to the method of claim 1.

14. The semiconductor device of claim 13, configured as a transistor.

15. The semiconductor device of claim 13, configured as a field effect transistor.

* * * * *